United States Patent [19]
de Sorgo

[11] Patent Number: 5,781,412
[45] Date of Patent: Jul. 14, 1998

[54] CONDUCTIVE COOLING OF A HEAT-GENERATING ELECTRONIC COMPONENT USING A CURED-IN-PLACE, THERMALLY-CONDUCTIVE INTERLAYER HAVING A FILLER OF CONTROLLED PARTICLE SIZE

[75] Inventor: Miksa de Sorgo, Windham, N.H.

[73] Assignee: Parker-Hannifin Corporation, Cleveland, Ohio

[21] Appl. No.: 755,081

[22] Filed: Nov. 22, 1996

[51] Int. Cl.[6] ............................................. H05K 7/20
[52] U.S. Cl. .................... 361/704; 361/705; 361/706; 361/707; 361/708; 257/702; 257/706; 257/717
[58] Field of Search ........................... 361/704, 706, 361/708, 707, 715, 720, 722, 723, 705; 257/702, 706, 717; 165/185; 174/16.3

[56] References Cited

U.S. PATENT DOCUMENTS

| | | | |
|---|---|---|---|
| 3,846,824 | 11/1974 | Bell | 361/713 |
| 4,326,238 | 4/1982 | Takeda et al. | 361/722 |
| 4,626,961 | 12/1986 | Ono et al. | 361/751 |
| 4,709,301 | 11/1987 | Yamaguti | 361/705 |
| 4,764,845 | 8/1988 | Artus | 361/387 |
| 4,782,893 | 11/1988 | Thomas | 165/185 |
| 4,869,954 | 9/1989 | Squitieri | 428/283 |
| 4,931,479 | 6/1990 | Morgan | 521/76 |
| 4,965,699 | 10/1990 | Jorden et al. | 361/387 |
| 4,971,633 | 11/1990 | Beavis et al. | 136/246 |
| 4,974,119 | 11/1990 | Martin | 361/386 |
| 4,979,074 | 12/1990 | Morley et al. | 361/386 |
| 5,060,114 | 10/1991 | Feinberg et al. | 361/706 |
| 5,137,959 | 8/1992 | Block et al. | 524/430 |
| 5,194,480 | 3/1993 | Block et al. | 524/404 |
| 5,213,868 | 5/1993 | Liberty et al. | 428/131 |
| 5,225,265 | 7/1993 | Prandy et al. | 428/138 |
| 5,298,791 | 3/1994 | Liberty et al. | 257/707 |
| 5,321,582 | 6/1994 | Casperson | 361/713 |
| 5,518,758 | 5/1996 | Tiburtius et al. | 427/8 |
| 5,661,902 | 9/1997 | Katchmar | 361/719 |

FOREIGN PATENT DOCUMENTS

| | | |
|---|---|---|
| 2126945 | 7/1996 | Canada. |
| 42 26 268A1 | 10/1994 | Germany. |

*Primary Examiner*—Leo P. Picard
*Assistant Examiner*—Boris L. Chervinsky
*Attorney, Agent, or Firm*—John A. Molnar

[57] ABSTRACT

Conductive cooling of a heat-generating electronic component disposable in spaced-apart adjacency with a surface of a thermal dissipation member to define a gap of predetermined width therebetween. A curable composition is provided as formed of an electrically-insulating polymeric binder having thermally-conductive, electrically-insulating filler particles dispersed therein. At least a portion of the filler particles is of a maximum average diameter about equal to the predetermined width of the gap. A layer of the composition is disposable in conductive heat transfer contact with the electronic component and the surface of the thermal dissipation member, and is cured to form an interlayer within the gap. At least a portion of the filler particles of the specified maximum average diameter each substantially directly contact the electronic component and the surface of the thermal dissipation member to establish thermally-conductive pathways effective to transfer heat from the electronic component to the heat dissipation member.

24 Claims, 1 Drawing Sheet

CONDUCTIVE COOLING OF A HEAT-GENERATING ELECTRONIC COMPONENT USING A CURED-IN-PLACE, THERMALLY-CONDUCTIVE INTERLAYER HAVING A FILLER OF CONTROLLED PARTICLE SIZE

BACKGROUND OF THE INVENTIOIN

The present invention relates broadly to the conductive cooling of a heat-generating electronic component. More particularly, the invention relates to the provision between the electrical component and a thermal dissipation member of an electrically-insulating interlayer having a thermally-conductive filler of controlled particle size selected to establish direct heat transfer pathways between the component and the dissipation member.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially semiconductor components such as transistors, are more prone to failure or malfunction at high temperatures. Thus, the ability to dissipate heat often is a limiting factor on the performance of the component.

Electronic components such as integrated circuit traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

As is described in U.S. Pat. Nos. 4,965,699 and 4,266,267, heat dissipation beyond that which is attainable by simple air circulation may be effected by the direct mounting of the electronic component to a "cold plate" or other heat sink. The heat sink may be a dedicated, thermally-conductive metal plate, or simply the chassis of the device. However, inasmuch as the chassis of the device generally is provided to be at ground potential, it is necessary to electrically insulate the electrical component from the chassis or other substrate to prevent shorting. In this regard, electrically-insulating, thermally-conductive interface materials have been employed between the electrical component and the heat sink. These interface materials may be compounded as containing one or more thermally-conductive particulate fillers dispersed within a polymeric binder, and may be provided in the form of cured sheets, tapes, pads, or films, or as adhesives or greases such as silicone grease.

Typically binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is a boron-nitride filled silicone elastomer which is marketed under the name CHO-THERM® by the Chomerics Division of Parker-Hannifin Corp., Woburn, Mass. Additionally, U.S. Pat. No. 4,869,954 discloses a cured, form stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, preferably are provided in a particle sizes ranging from about 1–50 microns (0.05–2 mils).

U.S. Pat .No. 4,764,845 discloses a thermally-cooled electronic assembly which includes a housing containing electronic components. A heat sink material fills the housing in direct contact with the electronic components for conducting heat therefrom. The heat sink material comprises a paste-like mixture of particulate microcrystalline material such as diamond, boron nitride, or sapphire, and a filler material such as a fluorocarbon or paraffin. The particle size distribution and packing of the heat sink material into the housing is such as to provide a mean particle to particle distance of 0.004 mils (0.1 microns).

U.S. Pat. No. 4,782,893 discloses a thermally-conductive, electrically-insulative pad for placement between an electronic component and its support frame. The pad is formed of a high dielectric strength material in which is dispersed diamond powder. In this regard, the diamond powder and a liquid phase of the high dielectric strength material may be mixed and then formed into a film and cured. In one embodiment, the diamond is provided as having a particle size which is the same or slightly greater than the thickness of the film. After the film is formed, a thin layer thereof is removed by chemical etching or the like to expose the tips of the diamond particles. A thin boundary layer of copper or other metal then is bonded to the top and bottom surfaces of the film such that the exposed diamond tips extend into the surfaces to provide pure diamond heat transfer paths across the film. The pad may be joined to the electronic component and the frame with solder or an adhesive.

U.S. Pat. No. 4,965,699 discloses a printed circuit device which includes a memory chip mounted on a printed circuit card. The card is separated from an associated cold plate by a layer of an uncured silicone elastomer which is applied to the surface of the cold plate.

U.S. Pat. No. 4,974,119 discloses a heat sink assembly which includes an electronic component supported on a printed circuit board in a spaced-apart relationship from a heat dispersive member. A thermally-conductive, elastomeric layer is interposed between the board and the electronic component. The elastomeric member may be formed of silicone and preferably includes a filler such as aluminum oxide or boron nitride.

U.S. Pat. No. 4,979,074 discloses a printed circuit board device which includes a circuit board which is separated from a thermally-conductive plate by a pre-molded sheet of silicone rubber. The sheet may be loaded with a filler such as alumina or boron nitride.

U.S. Pat. No. 5,137,959 discloses a thermally-conductive, electrically insulating interface material comprising a thermoplastic or cross linked elastomer filled with hexagonal boron nitride or alumina having an average particle size diameter of from about 2–50 microns (0.08–2 mils). The material may be formed as a mixture of elastomer and filler, which then may be cast or molded into a sheet or other form.

U.S. Pat. No. 5,194,480 discloses another thermally-conductive, electrically-insulating filled elastomer. A preferred filler is hexagonal boron nitride having a particle size of from about 5–200 microns (2–8 mils). The filled elastomer may be formed into blocks, sheets, or films using conventional methods.

U.S. Pat. Nos. 5,213,868 and 5,298,791 disclose a thermally-conductive interface material formed of a polymeric binder and one or more thermally-conductive fillers. The fillers may be particulate solids, such as aluminum oxide, aluminum nitride, boron nitride, magnesium oxide, or zinc oxide, having a particle size of about 1–50 microns (0.05–2 mils). The material may be formed by casting or molding, and preferably is provided as a laminated acrylic pressure sensitive adhesive (PSA) tape. At least one surface of the tape is provided as having channels or through-holes formed therein for the removal of air from between that surface and the surface of a substrate such as a heat sink or an electronic component.

U.S. Pat. No. 5,321,582 discloses an electronic component heat sink assembly which includes a thermally-conductive laminate formed of polyamide which underlays a layer of a boron nitride-filled silicone. The laminate is interposed between the electronic component and the housing of the assembly.

As the above-described compositions have garnered acceptance for use as interface materials in conductively-cooled electronic component assemblies, it will be appreciated that further improvements in these materials and in the methods of fabricating assemblies of the same would be well-received by the electronics industry. Especially desired would be a composition which could be easily and economically applied in a fluent state directly to a circuit board, heat sink, circuit board, or the like, and then cured-in-place to provide a thermally-conductive, electrically-insulating interface material exhibiting optimum heat transfer properties.

BROAD STATEMENT OF THE INVENTION

The present invention is directed to the conductive cooling of a heat-generating electronic component. A layer of a thermally-conductive, electrically-insulative composition is disposed within a gap which is defined between the component and a thermal dissipation member such as a circuit board or heat sink. The composition is formed of a curable, electrically-insulating polymeric binder having electrically-insulating, thermally-conductive filler particles dispersed therein. The layer of the composition is curable to form an interlayer within the gap. The fillers particles are selected such that at least a portion thereof are of a maximum average diameter which is about equal to the width of the gap. In this way, substantially direct contact is facilitated between the electronic component and the thermal dissipation member to thereby establish thermally-conductive pathways for improved transfer heat from the component to the heat dissipation member.

It therefore is a feature of the present invention to provide for the conductive cooling of a heat-generating electronic component. The component is disposable in spaced-apart adjacency with a surface of a thermal dissipation member to define a gap of predetermined width therebetween A curable composition is provided as formed of an electrically-insulating polymeric binder having thermally-conductive, electrically-insulating filler particles dispersed therein. At least a portion of the filler particles is of a maximum average diameter which is about equal to the predetermined width of the gap. A layer of the composition is disposable in conductive heat transfer contact with the electronic component and the surface of the thermal dissipation member, and is cured to form an interlayer within the gap. At least a portion of the filler particles of the specified maximum average diameter each substantially directly contact the electronic component and the surface of the thermal dissipation member to establish thermally-conductive pathways effective to transfer heat from the electronic component to the heat dissipation member.

It is a further feature of the invention to provide a conductively-cooled electrical assembly which includes a thermal dissipation member having an outer surface and a heat-generating electronic component. The component is disposed in spaced-apart adjacency with the surface of the thermal dissipation member to define a gap of predetermined width therebetween. A cured-in-place interlayer is disposed within the gap in conductive heat transfer contact with the electronic component and the surface of the thermal dissipation member. The interlayer is formed of an electrically-insulating polymeric binder having thermally-conductive, electrically-insulating filler particles dispersed therein. At least a portion of the particles are of a maximum average diameter about equal to the predetermined width of the gap and substantially directly contact the electronic component and the surface of the thermal dissipation member to establish heat transfer pathways from the electronic component to the thermal dissipation member.

Advantages of the present invention include the provision of a curable interlayer composition having filler particles of a maximum average diameter selected for improved conductive heat transfer between a heat-generating electronic component and an associated thermal dissipation member such as a circuit board or heat sink. Additionally advantages include a curable composition which may be applied in a fluent state to a surface of the electrical component or thermal dissipation member, and then cured-in-place on that surface or as interposed between the component and the dissipation member to form a thermally-conductive, electrically-insulating interlayer exhibiting improved heat transfer properties. These and other advantages will be readily apparent to those skilled in the art based upon the disclosure contained herein.

BRIEF DESCRIPTION OF THE DRAWINGS

For a filler understanding of the nature and objects of the invention, reference should be had to the following detailed description taken in connection with the accompanying drawings wherein.

DETAILED DESCRIPTION OF THE INVENTION

Figure 1:
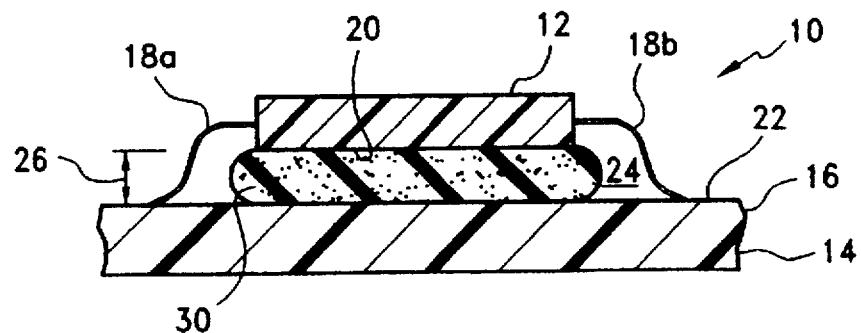
FIG. 1 is a fragmentary, cross-sectional view of an electrical assembly wherein an electronic component thereof is conductively cooled in accordance with the present invention via the provision of an interlayer of a thermally-conductive, electrically-insulating curable composition between the component and an associated circuit board.

Referring to the drawings wherein corresponding reference characters indicate corresponding elements throughout the figures, shown generally at 10 in FIG. 1 is an electrical assembly which includes a heat-generating, digital or analog electronic component, 12, disposed on an associated thermal dissipation member, 14. Thermal dissipation member 14 has a heat capacity relative to that of component 12 to be effective in dissipating thermal energy transferred from component 12. For purposes of the present illustration, thermal dissipation member 14 is shown as a printed circuit board or other substrate, 16, which supports component 12 and separates it from other electronic components (not shown). Electrical component 12 may be an integrated microchip, transistor, or other semiconductor, or an ohmic or other heat-generating subassembly such as a diode, relay, resistor, transformer, amplifier, diac, or capacitor. For the electrical connection of component 12 to board 16, a pair of leads or pins, 18a and 18b, are provided as extending from either end of component 12 into a soldered or other connection with board 16. Leads 18 additionally support component 12 above board 16 such that an external heat transfer surface, 20, of component 12 is spaced-apart from an opposing surface, 22, of board 16. A gap, represented at 24 as being of a predetermined width, 26, is thereby defined between component 12 and board 16. For most circuit board applications, gap width 26 typically will be about 3 mils (75 microns).

In accordance with the precepts of the present invention, a thermally-conductive, electrically-insulating interlayer, 30, is disposed within gap 24 in conductive heat transfer contact with surface 20 of component 12 and opposing surface 22 of board 16. Interlayer 30 at least partially fills gap 24 to provide a conductive path therethrough for the transfer of thermal energy from component 12 to board 16. Such path may be employed without or in conjunction with convective air circulation for effecting the cooling of component 12 and ensuring that the operating temperature thereof is maintained below specified limits.

Figure 2:
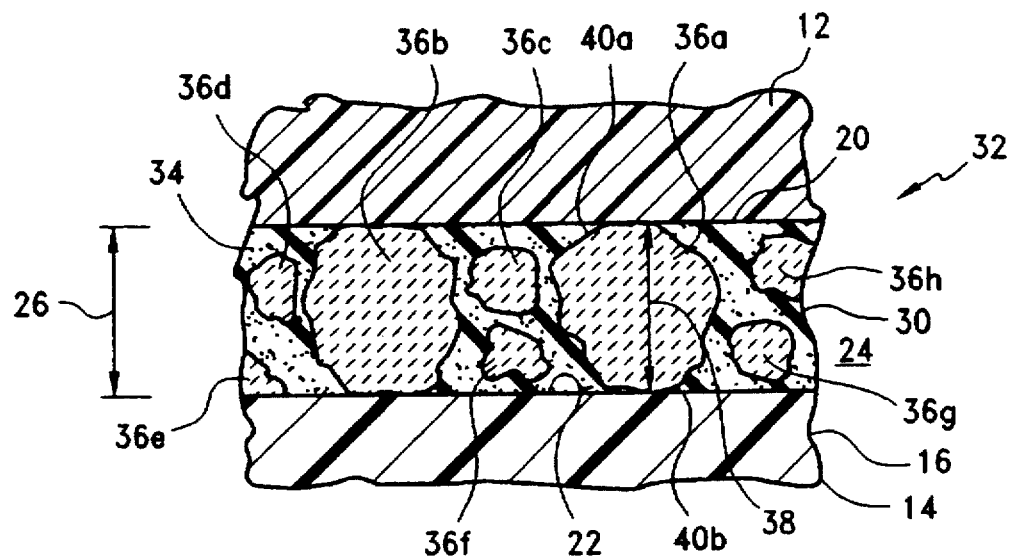
FIG. 2 is a cross-sectional view of a portion of the electrical assembly of FIG. 1 which is enlarged to detail the internal morphology of the interlayer composition of the present invention.

Referring next to FIG. 2, the internal morphology of interlayer 30 is revealed generally at 32. In general composition, interlayer 12 is formed of continuous phase of an electrically-insulating, cured polymeric binder or matrix, 34, within which is dispersed a plurality of thermally-conductive, electrically-insulating filler particles 36a–h. Filler particles 36 may be of a substantially uniform size or, as is shown, as having a distribution which includes a range of particles sizes. In whatever form provided, however, at least a portion of filler particles 36, represented by filler particles 36a–b, is provided to be of a maximum average diameter or diametric extent, shown at 38, which is about equal to predetermined width 26 of gap 24. Where particles 36 are provided as of a uniformly graded size, substantially all of the particles will be of the specified maximum average diameter. Alternatively, where particles 36 are provided as having a size distribution, a portion of the particles representing the maximum average diameter of the population will be of the specified maximum average diameter.

As is represented again by filler particles 36a–b, at least a portion of those filler particles 36 having the specified dimension each are made independently within interlayer 30 to substantially directly contact surface 20 of component 12 and opposing surface 22 of board 16. That is, with reference to particle 36a, a first end, 40a, of the particle contacts surface 20 of component 12, with a corresponding second end, 40b, of the particle contacting surface 22 of board 16. In this way, thermally-conductive pathways are established directly through particles 36a–b for transferring heat from component 12 to board 16. As filler particles 36 may be characterized as exhibiting thermal conductivities which are higher than those associated with continuous polymeric binder phase 34, it will be appreciated that interlayer 30 exhibits heat transfer and other thermal properties which are improved as compared to the interface materials heretofore representative of the state of the art. For example, higher bulk thermal conductivities may be realized at lower filler loadings.

Polymeric binder 34 may be a thermosetting or thermoplastic material, and may be selected from a variety of commercially-available resins and elastomers such as polyurethanes, polyimides, nylons, polyamides, polyesters, epoxies, polyolefins, polyetheretherketones, silicones, fluorosilicones, thermoplastic elastomers, acrylics, and copolymers and blends thereof However, owing to their excellent thermal and electrical properties, silicone resins and elastomers, which may be one- or two-part systems that are room temperature vulcanizing (RTV) in the presence of a curing agent or catalyst, or that are photoinitiated or moisture cured, are to be considered preferred.

Thermally-conductive, electrically-insulating particulate solids suitable for use as filler particles 36 include boron nitride, aluminum oxide, aluminum nitride, magnesium oxide, zinc oxide, silicon carbide, beryllium oxide, and mixtures thereof As aforementioned, filler particles 36 are provided as having a average particle size or maximum average size distribution selected relative to width 26 of gap 24 to be substantially equal thereto. For example, with width 26 being given as about 3 mils (75 microns), the corresponding average particle or maximum average size distribution of filler 36 will be about 3 mils (75 microns). Likewise, with width 26 being given as about 5 mils (125 microns), the corresponding average particle or maximum average size distribution of filler 36 will be about 5 mils (125). In contrast, most of the interface materials hereto known in the art, lacking the controlled particle size distribution which is characteristic of the present invention, have typical particle size distributions which range from about 1–1.5 mils (25–40 microns). Although there is no theoretical upper limit for either the width 26 of gap 24, or the particle size or diametric extent 38 of filler 36, a practical upper limit of about 8–10 mils (200–250 mils) may be realized depending upon the size availability of the selected filler, and on the limitations of the processing equipment available for compounding and delivery of the material.

Filler 36 is to be included within polymeric binder 34 in a proportion sufficient to provide the thermal conductivity desired for the intended application. In this regard, inasmuch as there are established direct heat transfer paths through individual filler particles, the bulk thermal conductivity of interlayer 30 is generally proportional to the filler density. For typical applications, interlayer 30 may be provided as including about 50–55% by weight, corresponding to about 30% by volume, of filler 36.

Additional fillers and additives may be included in interlayer 30 to the extent that the thermal conductivity and other physical properties thereof are not overly compromised. For example, a solvent or other diluent may be employed during the compounding of binder 34 in order to lower the viscosity thereof and improve the mixing and application/delivery of the material. Pigments, flame retardants, and antioxidants also may be added depending upon the particular application envisioned.

Figure 3:
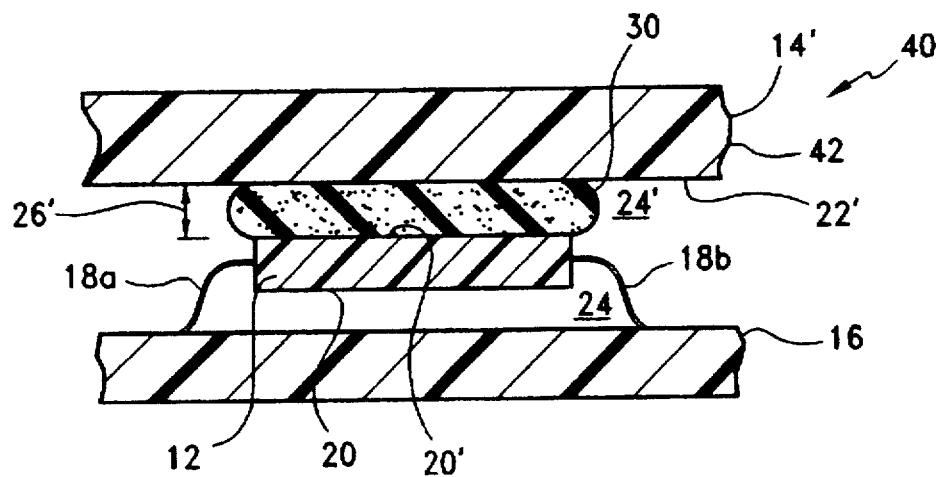
FIG. 3 is a fragmentary, cross-sectional view of an alternative embodiment of a conductively-cooled electrically assembly in accordance with the present invention wherein the thermally-conductive, electrically-insulating interlayer of FIG. 1 is interposed between the electrical component and an associated heat sink.

Turning next to FIG. 3, an alternative arrangement of the conductively-cooled electrical assembly 10 of the present invention is shown generally at 40. Assembly again includes heat-generating electronic component 12 which is supported on printed circuit board 16 via leads 18a and 18b. In embodiment 40, however, component 12 is interposed between board 16 and separate thermal dissipation member which is shown at 14' to be a separate heat sink member. Dissipation member 14' is supported over component 12, and is shown for purposes of illustration to be configured as a thermally-conductive plate, 42, which may be formed of a metal such as aluminum or other material having a relatively high heat capacity and other thermal dissipation properties.

As before, component 12 is supported above board 16 such that an external heat transfer surface, 20', of component 12 is spaced-apart from an opposing surface, 22', of plate 42. A gap, represented at 24' as being of a predetermined width, 26', is thereby defined between component 12 and plate 42. Thermally-conductive, electrically-insulating interlayer 30 is disposed within gap 24' in conductive heat transfer contact with surface 20' of component 12 and opposing surface 22' of plate 42. Again, interlayer 30 at least partially fills gap 24' to provide a conductive path therethrough for the transfer of thermal energy from component 12 to plate 42. Gap 24 between surface 20 of component 12 and surface 22 of board 16 may be left unfilled to further assist the conductive cooling of component 12. Alternatively, gap 24 may be filled, as was described in connection with FIG. 1, with a second interlayer 30 (not shown) to provide a second conductive heat transfer path from component 12.

Interlayer 30 may be incorporated with assemblies 10 or 40 of the present invention as being formed from a layer of a curable composition which is applied in a fluent state to surface 22 of board 16 (FIG. 1) prior to the mounting of component 12 thereon, or to surface 20' of component 12 (FIG. 3) prior to the disposition of component 12 in a spaced-apart adjacency from heat sink plate 42. In both of the described variations, the applied layer of the curable composition may be cured either prior to assembly or, after assembly, in situ within gap 24 (FIG. 1) or 24' (FIG. 3). By "cured," it is meant that the binder of the composition is polymerized, cross-linked, further cross-linked or polymerized, vulcanized, cooled, hardened, or otherwise chemically or physically changed from a liquid or other fluent into a solid resin, elastomeric, or other polymeric phase.

Alternatively, interlayer 30 may be provided as being formed from a layer of a curable composition which is injected or extruded in a fluent state into gap 24 of assembly 10 (FIG. 1), or gap 24' of assembly 10 (FIG. 3), wherein which it is cured in situ. In all of the abovedescribed variations, it will be appreciated that interlayer 30 of the present invention is cured-in-place on either a surface of component 12 or thermal dissipation member 14 or 14', or in situ between component 12 and thermal dissipation member 14 or 14'. In this regard, the necessity to pre-form the interface material as a sheet or pad, and then to apply the material to the component or dissipation member as separate steps is obviated. Moreover, waste generation is reduced with the present flashless process as compared to die cut or molding processes. The cure-in-place process of the present invention additionally is less labor intensive as being amenable to a more automated operation.

In a preferred embodiment, the thermally-conductive interlayer of the present invention is provided as formed-in-place from a curable composition which comprises a binder of an RTV silicone elastomer loaded with about 50–55wt % of graphitic boron nitride (BN) filler particles. The BN filler is selected as having a thermal conductivity of about 25–50 W/m-°K, and is milled or otherwise processed to have a maximum particle size distribution of at least about 3 mils (75 microns) and, desirably, at least about 5 mils (125 microns). Suitable RTV silicones are marketed commercially by Dow Corning Corp. Midland, Mich.), General Electric Co. (Silicone Products Div., Pittsfield, Mass.), and Shinetsu Corp. (Torrance, Calif.). Preferably, the silicone binder is provided as a two-part formulation of two reactive components and a platinum catalyst.

Suitable BN fillers are marketed commercially by Advanced Ceramic Corp. (Cleveland, Ohio. The filler is available as a mixture which contains a particle size distribution of 14–15 mils (355–380 microns) maximum, 8–9 mils average (200–230 microns), and 3–4 mils (75–100 microns) fines. Each of the reactive components is pre-mixed with the BN fillers particles using a planetary mixer or the like. The components then are separately passed through a 3-roll mill or the like to reduce the particle size of the filler to about a 4–5 mil (100–125 microns) maximum. In this regard, the rolls of the mill are set to have a gap of about 5 mils (125 microns) therebetween to achieve the controlled particle size which is characteristic of the present invention. This is to be contrasted with a conventional milling process which would reduce the size of the filler down to elementary particles of about a 1–1.5 mil (25–40 microns) maximum.

After compounding, the components may be stored for later reactive processing using a hand-held caulking gun, which may be of a cartridge-fed, static-mixer variety, or, alternatively, using automated injection equipment such as a robotic applicator. Immediately prior to application, the components are admixed and then delivered as a reactive mixture to a surface of the electrical assembly wherein the mixture is cured-in-place to form the thermally-conductive interlayer of the present invention. To reduce the cycle time, the curing may be effected at an elevated temperature to accelerate the vulcanization reaction. The components alternatively may be pre-mixed and then frozen for storage. To facilitate mixing and application, it is preferred that the admixture is formulated to have a viscosity of about 300,000 cp. It has been empirically observed that the relatively larger filler particle size of the composition of the present invention achieves fluent viscosities at higher filler loading proportions, e.g., 50–55 wt %, as compared to the compositions heretofore known in the art which are characteristically loaded at 35–40 wt %. Moreover, as the graphitic BN filler of the preferred embodiment may be considered a lubricant relative to the abrasive oxide fillers common in conventional formulations, improved tool life is realized for the mixing, metering, and delivery equipment which may be employed in connection with the present invention.

As an alternative to the above-described 2-part RTV system, a one-part system may be provided as comprising, for example, a hydrolyzable polyfunctional silane or siloxane which is activated by atmospheric moisture. In whatever form the silicone-based system of the present invention is provided, due to the affinity of the silicone polymer for most surfaces, excellent adhesion of the cured material to substrates may be realized without the use of primers or the like. If desired, however, a primer such as a functionalized silane, silicate ester, cyanurate, or the like may be used.

The Example to follow, wherein all percentages and proportions are by weight unless otherwise expressly indicated, is illustrative of the practicing of the invention herein involved, but should not be construed in any limiting sense.

EXAMPLE

A two-part, RTV silicone-based curable composition for forming the thermally-conductive, electrically-insulative interlayer of the present invention was compounded as is set forth in Table 1:

TABLE 1

Preparation of 2-Part RTV Formulation

Part A:

200 parts silicone resin (GE 615A, GE Silicone Products Div.)
225 parts boron nitride particles (HCM-grade, Advanced Ceramics)[1]

Part B:

200 parts silicone resin (GE 615B, GE Silicone Products Div.)
225 parts boron nitride particles (HCM-grade, Advanced Ceramics)
10 parts blue pigment (D 4900 grade, Harwick Chemical)

[1]particle size distribntion of 14–15 mils (355–380 microns) maximum, 8–9 mils average (200–230 microns) and 3–4 mils (75–100 microns) fines Each of Parts A and B was prepared in a Ross double planetary mixer (Charles Ross & Sons) by premixing the BN filler into the silicone resin until homogeneous. The pre-mixed components were then separately passed through a Ross three roll mill (Charles Ross & Sons). The rolls of the mill were set as having a gap spacing of about 5 mils in order to effect the reduction of the filler to about a 4–5 mil (100–125 mil) maximum.

Formulated as described, the Part A and B components then were loaded into a syringe-or caulking-type gun (Charles Ross & Sons) having a static mixing nozzle and a dual piston displacement set for a mix ratio of 10:1 by volume of A:B, i.e., 38 cc Part A to 3.8 cc Part B. A quantity of the mixed material was delivered from the gun and cured at room temperature for 48 hours. The following physical properties are representative of the cured composition, and confirm the suitability thereof for the intended application:

TABLE 2

| Representative Physical Properties | |
|---|---|
| Volume Resistivity | $10^{13}$ Ω-cm |
| Dielectric Strength | 500 VAC/mil |
| Hardness | 70 Shore A |
| Thermal Conductivity | 1.2 W/m-°K. |
| Specific Gravity | 1.50 |

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed:

1. A method of conductively cooling a heat-generating electronic component disposable in spaced-apart adjacency with a surface of a thermal dissipation member to define a gap of a predetermined width therebetween, said method comprising the steps of:

(a) providing a curable, fluent composition comprising an electrically-insulating polymeric binder having thermally-conductive, electrically-insulative filler particles dispersed therein, said particles having a thermal conductivity of between about 25–50 W/m-K and at least a portion thereof being of a maximum average diameter about equal to the predetermined width of the gap;

(b) providing a layer of said composition disposable in conductive heat transfer contact with the electronic component and the surface of the thermal dissipation member; and (c) curing said layer of said composition to form an interlayer within the gap having a continuous phase of said binder and a dispersed phase of said filler particles, at least a portion of said filler particles of said maximum average diameter each substantially directly contacting the electronic component and the surface of the thermal dissipation member to establish thermally-conductive pathways effective to transfer heat from the electronic component to the heat dissipation member.

2. The method of claim 1 wherein the thermal dissipation member is a heat sink or a circuit board.

3. The method of claim 1 wherein said layer of said composition is provided in step (b) as applied in a fluent state on the surface of the thermal dissipation member, and wherein said method further comprises an additional step after step (b) of disposing said electronic component on said layer.

4. The method of claim 1 wherein said layer of said composition is provided in step (b) as applied in a fluent state to an outer surface of said electronic component, and wherein said method further comprises an additional step after step (b) of disposing said thermal dissipation member on said layer.

5. The method of claim 1 further comprising an additional step prior to step (b) of disposing the electronic component in said spaced-apart adjacency with the surface of the thermal dissipation member, and wherein said layer is provided in step (b) by injecting the composition in a fluent state between said electronic component and the surface of the thermal dissipation member.

6. The method of claim 1 wherein said curable composition is provided in step (a) as comprising a first and a second reactive component each containing a portion of said filler particles, said method further comprising an additional step prior to step (b) of admixing said first and said second reactive component.

7. The method of claim 6 wherein said first reactive component comprises a silanol-terminated polymer and said second reactive component comprises a cross-linking agent, said reactive components combining when admixed to form a room- temperature vulcanizing (RTV) silicone elastomer forming said polymeric binder of said composition.

8. The method of claim 6 further comprising an additional step prior to step (b) of disposing the electronic component in said spaced-apart adjacency with the surface of the thermal dissipation member, and wherein said layer is provided in step (b) by injecting the admixed first and second reactive between the electronic component and the surface of the thermal dissipation member.

9. The method of claim I wherein said filler particles of said curable composition are selected from the group consisting of particles of boron nitride, aluminum oxide, aluminum nitride, magnesium oxide, zinc oxide, silicon carbide, beryllium oxide, and mixtures thereof.

10. The method of claim 1 wherein said filler particles comprise graphitic boron nitride.

11. The method of claim I wherein said polymeric binder of said curable composition is selected from the group consisting of polyurethanes, polyimides, nylons, polyamides, polyesters, polyolefins, epoxies, polyetheretherketones, silicone elastomers, fluorosilicone elastomers, thermoplastic elastomers, acrylic resins, and copolymers and blends thereof.

12. The method of claim 1 wherein said polymeric binder of said curable composition comprises a room temperature vulcanizing (RTV) silicone elastomer.

13. The method of claim 1 wherein said curable composition is provided as comprising about 50 to 55% by weight of said filler particles.

14. The method of claim 1 wherein the width of the gap between the electronic component and the surface of the thermal dissipation member is at least about 3 mils (75 microns).

15. The method of claim 1 wherein the average diameter of the portion of said particles of said curable composition provided as having a maximum average diameter substantially equal to the predetermined width of the gap is at least about 5 mils (125 microns).

16. A conductively-cooled electrical assembly comprising:

a thermal dissipation member having an outer surface;

a heat-generating electronic component disposed in spaced-apart adjacency with said surface of said thermal dissipation member to define a gap of a predetermined width therebetween; and a cured-in-place interlayer disposed within said gap in conductive heat transfer contact with said electronic component and the surface of said thermal dissipation member, said interlayer comprising a continuous phase of an electrically-insulating polymeric binder and a dispersed phase of thermally-conductive, electrically-insulating filler particles dispersed therein said continuous phase, said particles having a thermal conductivity of between about 25–50 W/m-K and at least a portion thereof being of a maximum average diameter about equal to the predetermined width of the gap and substantially directly contacting said electronic component and the surface of said thermal dissipation member to establish heat transfer pathways from said electronic component to said thermal dissipation member.

17. The electrical assembly of claim 16 wherein said thermal dissipation member is a heat sink or a circuit board.

18. The electrical assembly of claim 16 wherein said filler particles of said interlayer are selected from the group consisting of particles of boron nitride, aluminum oxide, aluminum nitride, magnesium oxide, zinc oxide, silicon carbide, beryllium oxide, and mixtures thereof.

19. The electrical assembly of claim 16 wherein said filler particles of said interlayer comprise graphitic boron nitride.

20. The electrical assembly of claim 16 wherein said polymeric binder of said interlayer is selected from the group consisting of polyurethanes, polyimides, nylons, polyamides, polyesters, polyolefins, epoxies, polyetheretherketones, silicone elastomers, fluorosilicone elastomers, thermoplastic elastomers, acrylic resins, and copolymers and blends thereof.

21. The electrical assembly of claim 16 wherein said polymeric binder of said interlayer comprises a room temperature vulcanizing (RTV) silicone elastomer.

22. The electrical assembly of claim 16 wherein said interlayer comprises about 50 to 55% by weight of said filler particles.

23. The electrical assembly of claim 16 wherein the width of said gap between said electronic component and the surface of said thermal dissipation member is at least about 3 mils (75 microns).

24. The electrical assembly of claim 16 wherein the average diameter of the portion of said particles of said interlayer having a maximum average diameter substantially equal to the predetermined width of said gap is at least about 5 mils (125 microns).

* * * * *